United States Patent
Kapil et al.

(10) Patent No.: US 7,523,282 B1
(45) Date of Patent: Apr. 21, 2009

(54) CLOCK ENABLE THROTTLING FOR POWER SAVINGS IN A MEMORY SUBSYSTEM

(75) Inventors: Sanjiv Kapil, Sunnyvale, CA (US); Aaron S. Wynn, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 252 days.

(21) Appl. No.: 11/260,416

(22) Filed: Oct. 27, 2005

(51) Int. Cl.
*G06F 13/00* (2006.01)
*G06F 1/26* (2006.01)
*G11C 8/18* (2006.01)

(52) U.S. Cl. .................. 711/167; 713/320; 365/233.11

(58) Field of Classification Search ....................... None
See application file for complete search history.

(56) References Cited

U.S. PATENT DOCUMENTS

| | | |
|---|---|---|
| 6,295,586 B1 | 9/2001 | Novak et al. |
| 6,502,161 B1 | 12/2002 | Perego et al. |
| 6,571,325 B1 | 5/2003 | Satagopan et al. |
| 6,636,074 B2 | 10/2003 | Schulz |
| 6,725,314 B1 | 4/2004 | Dong |
| 6,735,707 B1 | 5/2004 | Kapil |
| 6,882,082 B2 | 4/2005 | Greeff et al. |
| 6,922,770 B2 | 7/2005 | Shanmugasundaram et al. |
| 6,941,428 B2 | 9/2005 | Carr |
| 7,017,022 B2 | 3/2006 | Jeddeloh |
| 7,032,092 B2 | 4/2006 | Lai |
| 7,051,151 B2 | 5/2006 | Perego |
| 2004/0030794 A1 | 2/2004 | Hugly et al. |
| 2004/0183795 A1 | 9/2004 | Deering et al. |
| 2005/0198458 A1 | 9/2005 | Cho |
| 2005/0201192 A1* | 9/2005 | Honda ................ 365/233 |
| 2006/0020740 A1 | 1/2006 | Bartley et al. |
| 2006/0024541 A1 | 2/2006 | Weiss et al. |

(Continued)

FOREIGN PATENT DOCUMENTS

GB 2 416 056 A 1/2006

(Continued)

OTHER PUBLICATIONS

U.S. Appl. No. 11/124,848, filed May 9, 2005.

(Continued)

*Primary Examiner*—Reginald G Bragdon
*Assistant Examiner*—Eric S Cardwell
(74) *Attorney, Agent, or Firm*—Meyertons Hood Kivlin Kowert & Goetzel, P.C.; Rory D. Rankin

(57) ABSTRACT

A memory subsystem is disclosed. The memory subsystem includes a memory controller coupled to one or more memory modules. Each memory module comprises a buffer coupled to one or more memory ranks. A clock source is coupled to provide a clock signal to each of the memory modules. The memory controller is configured to convey a clock enable (CKE) command to one of the memory modules, the CKE command corresponding to a given memory rank. In response to the CKE command, a memory module buffer associated with the given memory rank is configured to convey a CKE disable signal to the given memory rank. The given memory rank is configured to disable operation of the clock signal within the given memory rank, responsive to the CKE disable signal.

23 Claims, 12 Drawing Sheets

U.S. PATENT DOCUMENTS

2006/0248355 A1* 11/2006 Thayer ...................... 713/300

FOREIGN PATENT DOCUMENTS

WO     WO 2004/109528 A3     12/2004
WO     WO 2005/066965 A2     7/2005

OTHER PUBLICATIONS

U.S. Appl. No. 11/304,166, filed Dec. 15, 2005.
U.S. Appl. No. 11/260,416, filed Oct. 27, 2005.
U.S. Appl. No. 11/205,706, filed Aug. 17, 2005.
U.S. Appl. No. 11/249,099, filed Oct. 12, 2005.
U.S. Appl. No. 10/975,650, filed Oct. 28, 2004.
U.S. Appl. No. 10/989,577, filed Nov. 16, 2004.
Fully Buffered DIMM (FB-DIMM) Server Memory Architecture: Capacity, Performance, Reliability and Longevity- Feb. 18, 2004- Retrieved from http://www.idt.com/content/OSA_FB-DIMM-arch. pdf VOGT-Note connections of FB-DIMM's on p. 9.

* cited by examiner

CLOCK ENABLE THROTTLING FOR POWER SAVINGS IN A MEMORY SUBSYSTEM

BACKGROUND OF THE INVENTION

1. Field of the Invention

This invention relates to computer memory systems and, more particularly, to techniques for reducing power consumption of computer memory systems.

2. Description of the Related Art

Evolving standards for computer memory systems have lead to systems that include greater numbers of higher capacity memory devices. Consequently, computer memory systems have seen an increase in power consumption. One technology in particular, the Fully Buffered Dual Inline Memory Module (FBDIMM), achieves very high memory density by allowing memory modules to be connected in series, rather than in parallel. A parallel architecture suffers from the problem that each additional memory module increases the electrical loading on the parallel data and address buses. The serial point-to-point architecture used by FB-DIMMs overcomes the electrical loading problem since electrical loading is not changed when another module is added. However, the resulting increase in the number of modules that the system can support increases the power consumption of the memory system.

In addition to the above considerations, the demands of the current generation of computers require memory systems to operate at ever increasing clock speeds. The speed of memory modules, rather than the speed of processors, is often the limiting factor for memory transactions. Consequently, computer memory systems have been designed to operate memory modules at the highest possible speeds. Unfortunately, power dissipation is directly proportional to clock speed for a typical memory module. In light of increasing memory densities and clock speeds, what is needed is a mechanism to reduce the power dissipation of individual memory modules within a memory system without significantly reducing access speed or increasing latency.

SUMMARY OF THE INVENTION

Various embodiments of a system and methods of throttling a clock of a memory subsystem are disclosed. In one embodiment, a memory subsystem comprises a memory controller coupled to one or more memory modules. Each memory module comprises a buffer coupled to one or more memory ranks. A clock source is coupled to provide a clock signal to each of the memory modules. The memory controller is configured to convey a first clock enable (CKE) command to at least one of the memory modules, the CKE command corresponding to a given memory rank. In response to the first CKE command, a memory module buffer associated with the given memory rank is configured to convey a CKE disable signal to the given memory rank. The given memory rank is configured to disable operation of the clock signal within at least a portion of the given memory rank, responsive to the CKE disable signal.

In a further embodiment, the memory controller is configured to convey a second clock enable (CKE) command. In response to the second CKE command: the associated buffer is configured to convey a CKE enable signal to the given memory rank. The given memory rank is configured to enable operation of the clock signal within the at least a portion of the given memory rank, responsive to the CKE enable signal.

Figure 1:
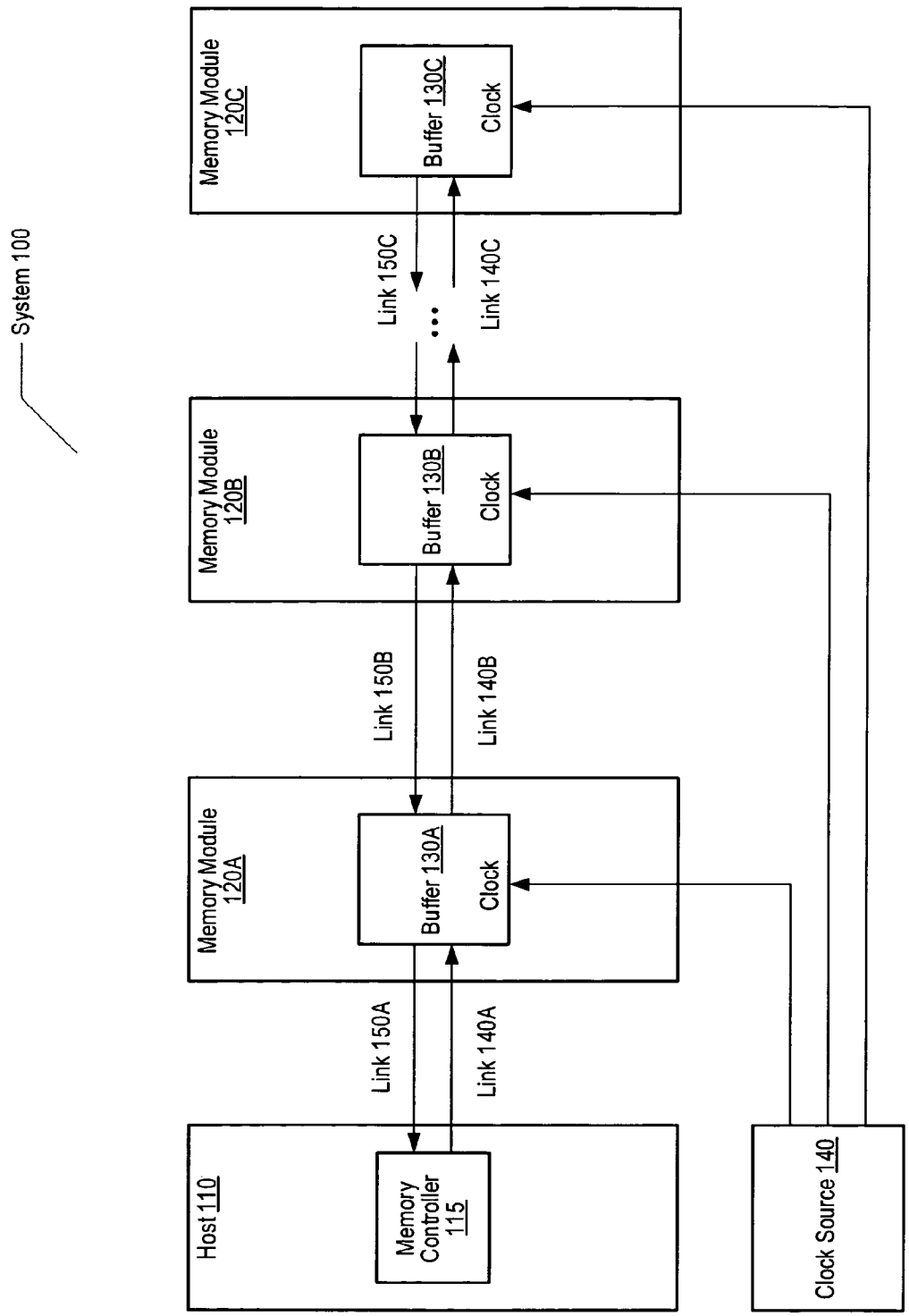
FIG. 1 is a generalized block diagram of one embodiment of a computer memory system.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 is a generalized block diagram of one embodiment of a computer memory system 100 including a host 110, one or more memory modules 120A-120C, and a clock source 140. In the discussions that follow, elements designated by a number followed by a letter may be referred to collectively using the number alone. For example, memory modules 120A-120C may be referred to collectively as memory modules 120. In the illustrated embodiment, host 110 may be a processor that includes a memory controller 115. In an alternative embodiment, a processor and a memory controller may be separate elements of host 110.

In one embodiment, each of memory modules 120 may be a fully buffered dual inline memory module (FB-DIMM) that includes a respective buffer 130A-130C. Buffers 130 may provide an interface between an array of DRAM devices and other FB-DIMMs or host 110 within system 100. The JEDEC Solid State Technology Association has published a draft specification for FB-DIMMs. The JEDEC FB-DIMM specification includes descriptions of the operation of a compliant memory module including the characteristics of buffers, the memory devices that populate memory modules, and the interconnection architecture of FB-DIMMs in a memory system. For example, buffers 130 may comply with an Advanced Memory Buffer (AMB) specification that is included in the FB-DIMM specification. Another aspect of the current FB-DIMM specification requires that an FB-DIMM-compliant memory module may be populated with double data rate 2 synchronous dynamic random access memory (DDRII SDRAM) devices. Alternatively, and/or in future revisions of the JEDEC Specification, FB-DIMMs that support other DRAM technologies such as DDR3 are possible and are contemplated.

In one embodiment, memory modules 120 and memory controller 115 may be interconnected via a number of serial links. For example, memory controller 115 may be coupled to buffer 130A through a bi-directional pair of links 140A and 150A that comply with the section of the JEDEC FB-DIMM specification that covers interconnection of memory modules. Additional links 140B and 150B may interconnect buffers 130A and 130B and so on, forming a ring. Each of links 140 and 150 may comprise a set of parallel lanes. Although only three memory modules 120 are illustrated in FIG. 1, more or less than three memory modules may be interconnected in the ring. For example, the JEDEC FB-DIMM specification describes support for up to eight memory modules in the ring, with each module including one or two memory ranks. A memory rank may be defined as a set of memory devices that are accessed by a single chip select signal. Consequently, according to the FB-DIMM specification there may be from 1 to 16 individually addressable ranks of memory accessible to memory controller 115. Accordingly, in FB-DIMM-compliant embodiments, system 100 may include from one to sixteen memory ranks. In alternative embodiments, system 100 may include any number of memory ranks, including more than sixteen memory ranks.

Each buffer 130 may receive a clock signal from clock source 140. In the illustrated embodiment, clock source 140 provides a separately buffered reference clock to each of buffers 130. The clock frequency may be one of a variety of frequencies that depend on the capabilities of the DRAM devices of each FB-DIMM. For example, common FB-DIMM devices may receive a reference clock of 133 MHz, 167 MHz, or 200 MHz and achieve a data rate of 532 MHz, 667 MHz, or 800 MHz, respectively. Buffer 130 may also convey a clock enable/disable signal (CKE) to either or both memory ranks within the associated memory module 120 in response to a CKE command received from memory controller 115. In the discussions that follow, disabling the clock for a given memory rank may be referred to as CKE throttling. A detailed description of the generation and transmission of CKE commands is provided below.

In operation, requests to access memory modules are initiated by software executing within host 110. Among the memory requests that may be conveyed to a memory module are read, write, initialization, control, and synchronization requests. In one embodiment, memory requests may be processed by memory controller 115 and conveyed to memory modules 120 within a frame of a fixed number of bits. Such requests may be referred to as "southbound" requests. For example, a southbound write request may comprise address, data, and command information packaged as a frame of 12 bits on each of ten lanes comprising links 140. Responses from memory modules 120 may also be conveyed back to memory controller 115 within a frame of a fixed number of bits. Such requests may be referred to as "northbound" requests. For example, a northbound response to a read request may comprise data packaged as a frame of between 12 to 14 bits on each of 12 lanes comprising links 150. Alternatively, the number of bits per frame and the number of lanes per link may vary from embodiment to embodiment depending on the desired aggregate bandwidth, space constraints on the number of connections, and other design criteria.

Figure 2:
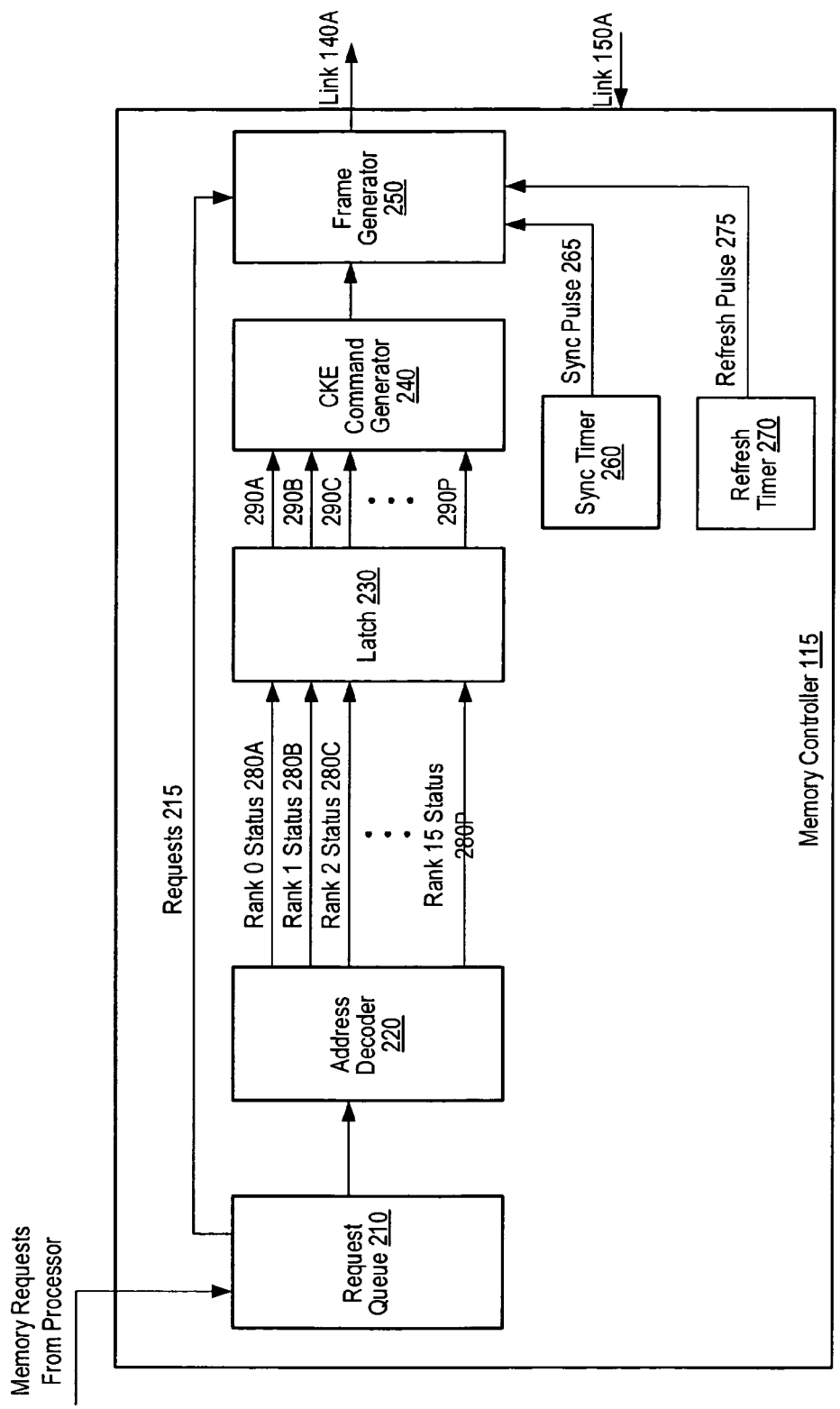
FIG. 2 is a generalized block diagram of one embodiment of memory controller 115.

FIG. 2 is a generalized block diagram of one embodiment of memory controller 115. In the illustrated embodiment, memory controller 115 includes a request queue 210, an address decoder 220, a latch 230, a CKE command generator 240, a frame generator 250, a sync timer 260, and a refresh timer 270. Request queue 210 may receive memory access requests from a processor within host 110. Generally speaking a memory access request may be any attempt to read data from, or write data to, one or more of the memory ranks within memory modules 120. Queuing memory requests may permit memory controller 115 to accept a new memory request without waiting for the completion of a transaction associated with a previous memory request. In one embodiment, host 110 may include a multithreaded processor in which each of several threads may execute in parallel. While one such thread is waiting for the completion of a memory request that has been placed in request queue 210, other threads may continue to execute.

Memory controller 115 may evaluate the contents of request queue 210 in order to identify opportunities to disable the clock of one or more memory ranks of memory modules 120. Specifically, address decoder 220 may read the contents of request queue 210 and maintain a count of the number of pending requests for each memory rank. In the illustrated embodiment, a count may be maintained for up to sixteen ranks. The number of ranks that are monitored is not limited to sixteen and may vary from embodiment to embodiment and depend on the architecture and number of memory modules 120 included in system 100. The resulting count values, rank statuses 280A-280P, may be temporarily stored in latch 230. The corresponding outputs of latch 230 (290A-290P) may be coupled to clock enable (CKE) command generator 240. CKE command generator 240 may read latch outputs 290 to determine if a CKE command may be generated for one or more memory ranks. For example, each time the state of one of latch outputs 290 changes, (e.g., increases), a CKE command may be generated.

In the event that CKE command generator 240 generates a CKE command, the command may be forwarded to frame generator 250. Frame generator 250 may package one or more commands into a command frame for transmission to memory modules 120 via link 140A. Frame generator 250 may also package memory access requests into frames. For example, frame generator 250 may process one or more requests 215 from request queue 210, package them into a frame, convey the frame to one or more of memory modules 120 via link 140A, and await a response or acknowledgement on link 150A. In addition, frame generator 250 may, in response to a sync pulse 265 from sync timer 260, transmit a sync frame to memory modules 120 in order to maintain clock synchronization within buffers 130. Frame generator 250 may also monitor refresh timer 270 and may, in response to receiving a refresh pulse 275, determine an interval in which a memory refresh may occur. A periodic memory refresh interval may be provided during which one or more rows of each DRAM device are refreshed according to well known DRAM refresh techniques to prevent loss of stored data.

Detailed descriptions of the timing relationships between sync frames, refresh intervals, and CKE throttling periods are given below.

Figure 3:
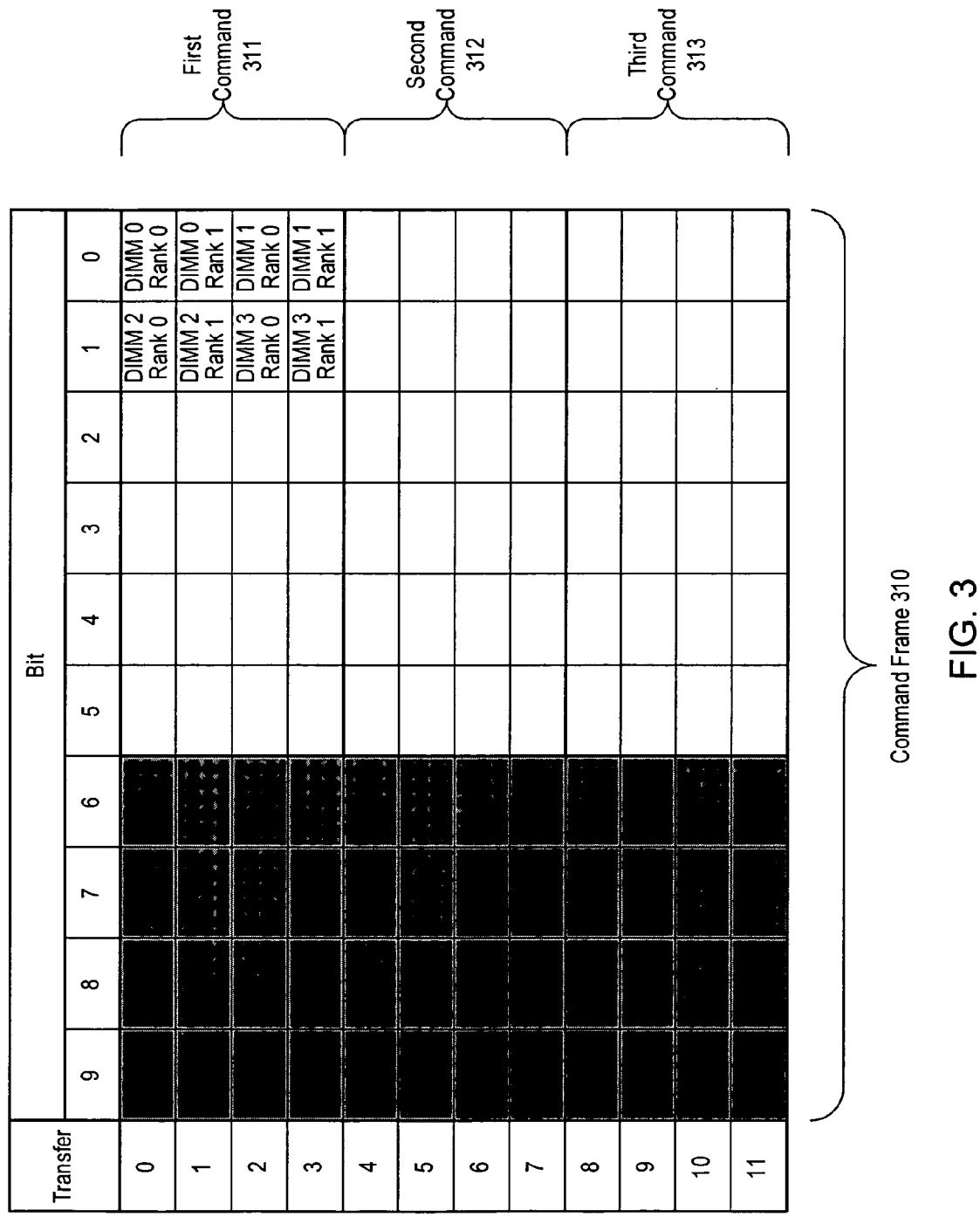
FIG. 3 illustrates one embodiment of the arrangement of bits in a command frame that includes a CKE throttling command.

FIG. 3 illustrates one embodiment of the arrangement of bits in a command frame 310 that includes a CKE throttling command. In the illustrated embodiment, the frame format complies with the FB-DIMM specification for a command frame. However, other embodiments are possible and are contemplated. In the embodiment shown, command frame 310 may be packaged as a frame of 12 bits on each of ten lanes comprising links 140. Accordingly, command frame 310 may comprise 120 bits. In one embodiment, three 24-bit commands may be packaged into a single command frame. The first two bits of each of the first 4 transfers (8 bits total) of a command frame may be CKE bits. As shown, the specified 8 bits of a first command 311 are CKE bits. The illustrated embodiment corresponds to a command frame in which each memory module 120 includes two memory ranks and a separate CKE bit may be assigned to each memory rank according to the position assignments shown in Table 1. Buffer 130 within a given memory module 120 may decode the CKE bits associated with the memory ranks and forward the decoded CKE values to the CKE inputs of the corresponding memory ranks.

TABLE 1

| DIMM | Rank | Bit Position | Transfer |
| --- | --- | --- | --- |
| 0 | 0 | 0 | 0 |
| 0 | 1 | 0 | 1 |
| 1 | 0 | 0 | 2 |
| 1 | 1 | 0 | 3 |
| 2 | 0 | 1 | 0 |
| 2 | 1 | 1 | 1 |
| 3 | 0 | 1 | 2 |
| 3 | 1 | 1 | 3 |

Various alternative embodiments of command frame 310 are possible. Any of a variety of pre-determined associations between bit positions and individual memory modules 120 or individual memory ranks within memory modules 120 may be used. In addition to the CKE bits of first command 311, a second and/or third command 312 or 313 may contain CKE bits assigned to additional ranks. Alternatively, the position of CKE bits in a frame may be determined according to a variety of architectures other than the JEDEC FB-DIMM specification.

Figure 4:
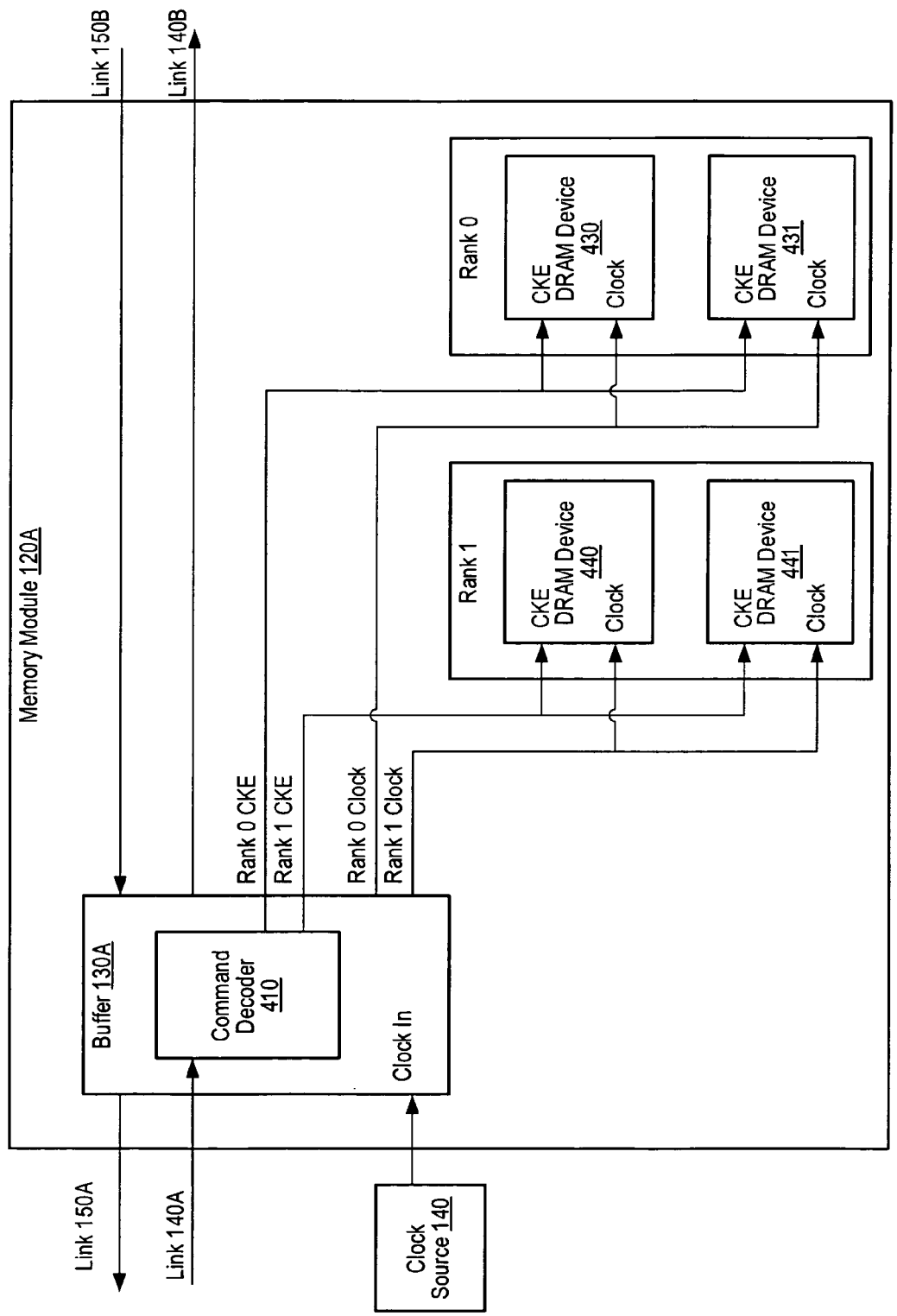
FIG. 4 is a generalized block diagram of one embodiment of memory module.

FIG. 4 is a generalized block diagram of one embodiment of memory module 120A that may be representative of any of memory modules 120. In the illustrated embodiment, memory module 120A may include buffer 130A and two ranks of DRAM devices. For example, DRAM devices 430 and 431 may constitute memory rank "0" while DRAM devices 440 and 441 may constitute memory rank "1". In operation, buffer 130A may receive a clock signal from clock source 140 and distribute it to both rank "0" and rank "1" DRAM devices. Buffer 130A may also distribute a rank "0" CKE signal to rank "0" DRAM devices and a rank "1" CKE signal to rank "1" DRAM devices. As shown, buffer 130A may include a command decoder 410 that may receive command frames from link 140A. If the received frame contains a command including one or more CKE bits that corresponds to one or both of the ranks within memory module 120A, command decoder 410 may detect the value of the CKE bits and transmit a rank "0" CKE and/or a rank "1" CKE signal to the "0" rank and "1" rank DRAM devices, respectively. In one embodiment, if the value of the CKE signal is negated (e.g., "0"), then the associated clock may be disabled. If the value of the CKE signal is asserted (e.g., "1"), then the associated clock may not be disabled.

Various alternative configurations of memory module 120A are possible. For example, in alternative embodiments, fewer than two or more than two DRAM devices may constitute each memory rank. In another alternative embodiment, memory module 120A may comprise a single memory rank.

Figure 5:
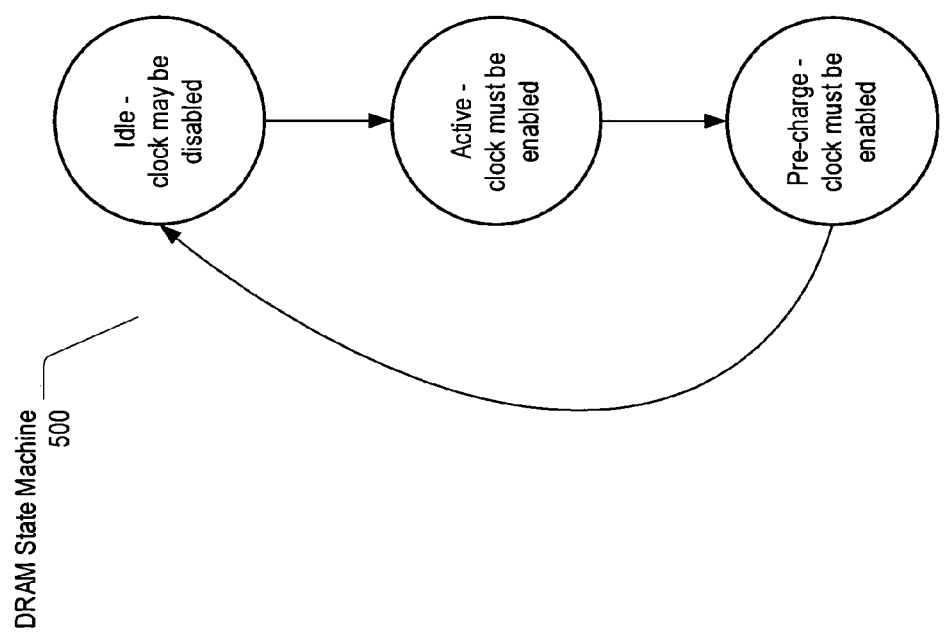
FIG. 5 is a high level state diagram of one embodiment of a DRAM device.

FIG. 5 is a high level state diagram 500 of one embodiment of a DRAM device, such as devices 430, 431, 440, and 441. Generally speaking, as shown, a DRAM device may be in one of three states. In the active state, a DRAM device may be involved in a read or a write transaction. Immediately after the completion of a read or a write transaction, a DRAM device may enter the pre-charge state in which the device is prepared to be able to execute another transaction. After a pre-charge interval, the DRAM device may enter an idle state awaiting the initiation of a read or write transaction. During periods in which a DRAM is in an active or a pre-charge state, proper operation may require that a clock signal be enabled. During the idle state, it may not be necessary for the clock to be enabled in order for the DRAM device to operate. The power consumed by a DRAM with its clock disabled may be significantly lower than if the clock is enabled. Various embodiments of systems and methods in which the DRAM device clock may be disabled are described below.

Figure 6:
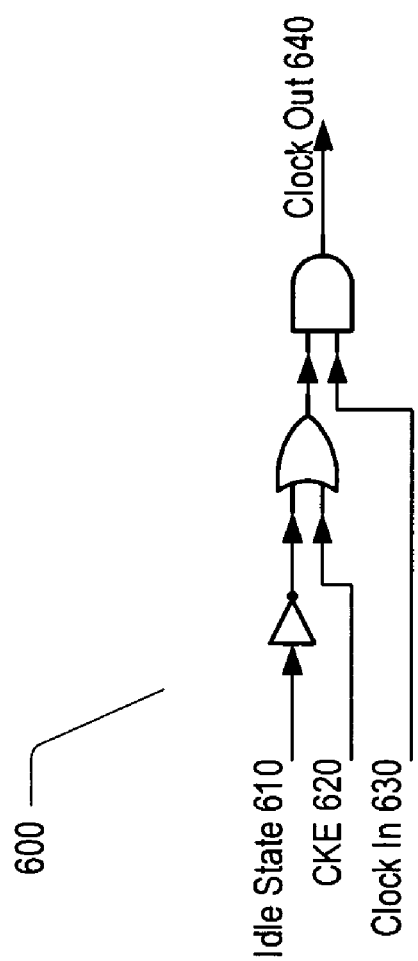
FIG. 6 illustrates one embodiment of a circuit that may be incorporated within a DRAM device to control the enabling and disabling of a clock signal.

FIG. 6 illustrates one embodiment of a circuit 600 that may be incorporated within a DRAM device to control the enabling and disabling of a clock signal. In the illustrated embodiment, an idle state 610 signal may be equal to "1" if the DRAM device is in the idle state. Otherwise, idle state 610 may be equal to "0". A CKE 620 signal and a clock in 630 signal may have values equal to the values of the CKE and clock signals respectively for the associated DRAM device. A clock out 640 signal may be enabled if CKE 620 is asserted or if the idle state 610 is de-asserted. Conversely, a clock out 640 signal may be disabled if CKE 620 is de-asserted and idle state 610 is asserted.

CKE throttling may be employed in a variety of ways to reduce the power dissipation of memory devices, depending on the operating mode of the computer memory system. In one operating mode, referred to as the "force option", CKE throttling may be employed to disable a DRAM device's clock in between any memory accesses. Accordingly, if the force option is selected, the DRAM clock for a given rank is enabled in response to an access request and disabled upon completion of the access, regardless of whether or not another access request is in the request queue for the given rank. The force option may be employed when maximum power saving is desired. However, the force option may increase the overall latency of memory accesses since some extra time may be needed to re-enable the DRAM clock. Alternatively, it is possible to employ CKE throttling without the force option. In that case, if a DRAM device's clock has been enabled for a memory access and additional access requests are pending in the request queue for that device, the device clock may not be throttled between accesses. Accordingly, average latency may be reduced although more power may be dissipated as compared to the force option. These and other embodiments of CKE throttling are described further below.

Figure 7:
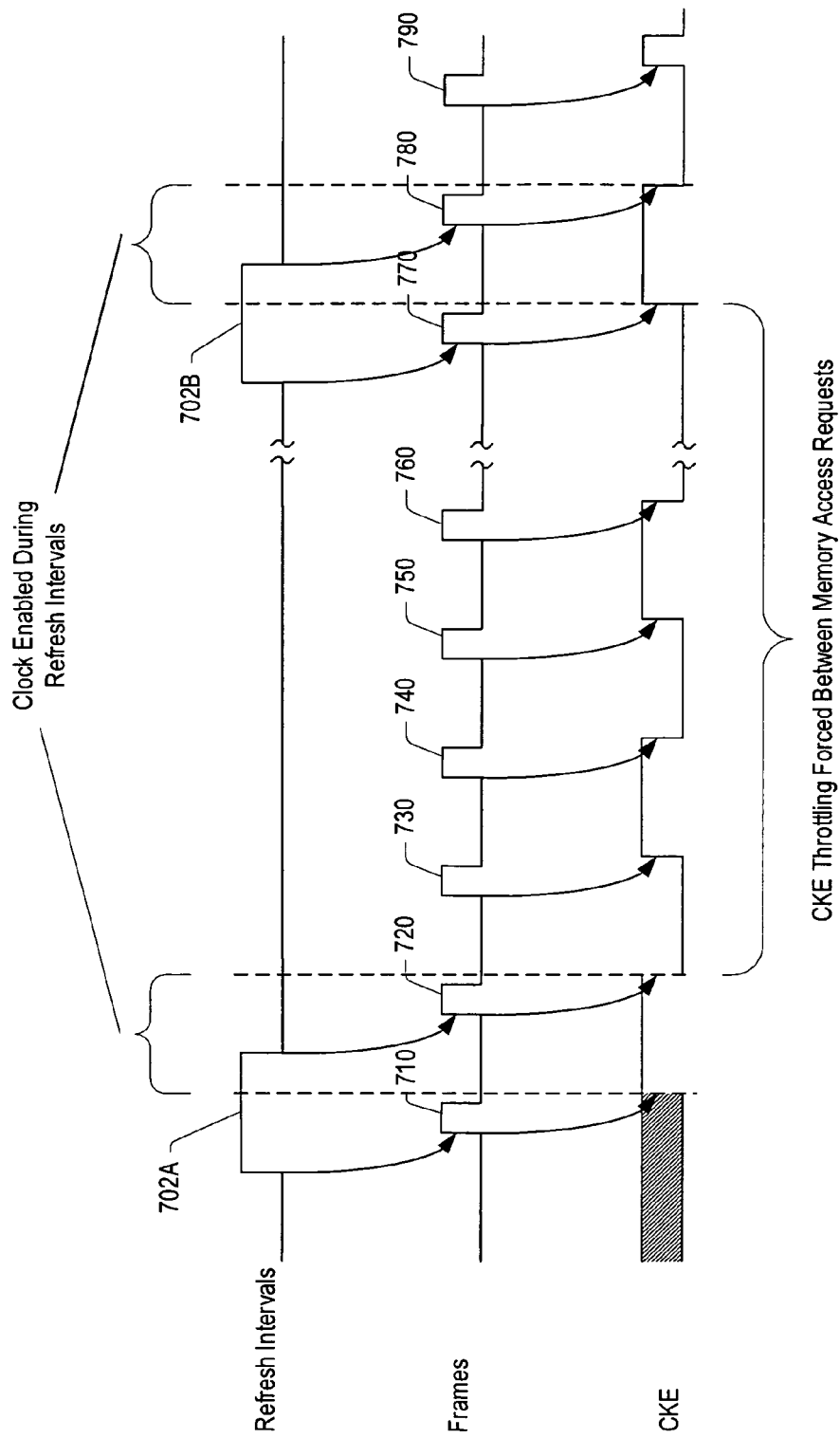
FIG. 7 illustrates one embodiment of the timing of signals that may be used to throttle the clock of a DRAM device during the time between refresh intervals that uses a force option.

FIG. 7 illustrates one embodiment of the timing of signals that may be used to throttle the clock of a DRAM device during the time between refresh intervals that uses a force option. As shown, a set of refresh intervals 702A, 702B, etc. may be associated with a set of command frames 710-790 that may be received by a buffer 130. In addition, the timing of transitions of CKE that enable and disable a clock to one or more DRAM devices is shown.

As described above, refresh timer 270 within memory controller 115 may issue a refresh pulse 275. A refresh pulse 275 may be issued on a periodic basis or at other times and frequencies sufficient to maintain the integrity of data stored within a memory module 120. For example, in one embodiment, the interval between refresh pulses may be several microseconds and the duration of a refresh pulse may be a fraction of a microsecond. Refresh interval 702A may begin at a time when frame generator 250 receives a refresh pulse 275. A refresh interval 702A may end at a time determined by the duration of refresh pulse 275. Similarly, additional refresh intervals such as 702B may start and end after the issuance of additional refresh pulses 275.

As shown in FIG. 7, frame 710 may be issued in response to the start of a refresh interval 702A and subsequently received by buffer 130. Frame 720 may be issued subsequent to the end of refresh pulse 275 and received by a buffer some time after the end of refresh interval 702A. Frames 770 and 780 may be similarly associated with refresh interval 702B. Other frames 730-760 and 790 may be different frames such as command frames, read frames, or write frames, etc., of which one example is described below.

In one embodiment, in response to the receipt of frame 710, CKE may be asserted causing the clock for the associated memory rank to be enabled during the refresh interval. In order to decrease power consumption of the associated memory rank, a frame that causes CKE to be de-asserted may follow any frame that causes CKE to be asserted. Accordingly, frame 720 follows frame 710 and, in response to receipt of frame 720, CKE may be de-asserted causing the clock for the associated memory rank to be disabled. A subsequent frame 730 may include a read or write transaction that corresponds to a request to access data stored in the associated memory rank. Frame 730 accordingly may cause CKE to be asserted, which further causes the clock for the associated memory rank to be enabled. Subsequent frame 740 may cause CKE to be de-asserted, thereby causing the clock for the associated memory rank to be disabled. Similarly, frame 750 may include a read or write transaction that corresponds to a request to access data stored in the associated memory rank. Frame 750 accordingly may cause CKE to be asserted, and so on for frames 760, etc. It is noted that two frames may be associated with each transaction when the force option is selected.

Figure 8:
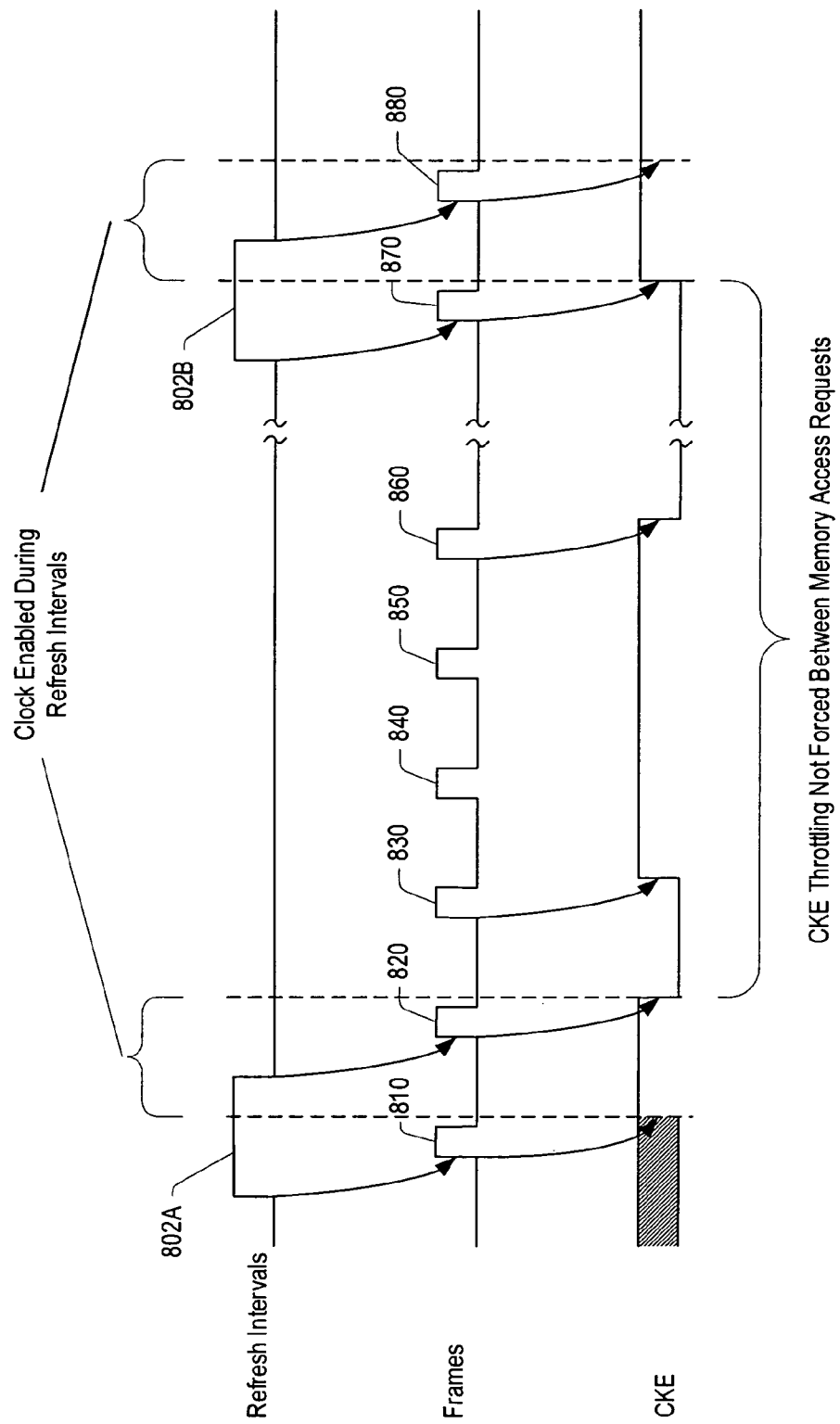
FIG. 8 illustrates an alternative embodiment of the timing of signals that may be used to throttle the clock of a DRAM device during the time between refresh intervals that does not use the force option.

FIG. 8 illustrates an alternative embodiment of the timing of signals that may be used to throttle the clock of a DRAM device during the time between refresh intervals that does not use the force option. As shown, a set of refresh intervals 802A, 802B, etc. may be associated with a set of command frames 810-880. In addition, the timing of transitions of CKE that enable and disable a clock to one or more DRAM devices is shown.

Refresh intervals 802A and 802B may be similar in time and duration to refresh intervals 702A and 702B, as previously described. As shown, frame 810 may be issued in response to the start of a refresh interval 802A and subsequently received by buffer 130. Frame 820 may be issued subsequent to the end of refresh pulse 275 and received by a buffer some time after the end of refresh interval 802A. Frames 870 and 880 may be similarly associated with refresh interval 802B. Other frames 830-860 may be different frames such as command frames, read frames, or write frames, etc., of which one example is described below.

In one embodiment, in response to the receipt of frame 810, CKE may be asserted causing the clock for the associated memory rank to be enabled during the refresh interval. In this embodiment, a frame that causes CKE to be de-asserted may or may not follow any frame that causes CKE to be asserted. In the example shown, frame 820, following frame 810, does cause CKE to be de-asserted, which causes the clock for the associated memory rank to be disabled. A subsequent frame 830 may include a read or write transaction that corresponds to a request to access data stored in the associated memory rank. Frame 830 accordingly may cause CKE to be asserted, which further causes the clock for the associated memory rank to be enabled. Subsequent frames 840 and 850 may also include a read or write transaction. Since CKE is still asserted, no change in CKE is made until frame 860 is received. Frame 860 includes a CKE command that is generated in response to detecting that request queue 210 contains no requests targeted to the associated memory rank. Frame 860 may therefore cause CKE to be de-asserted, thereby causing the clock for the associated memory rank to be disabled. Subsequent frame 870 is associated with the start of refresh interval 802B, during which CKE may be re-enabled. In contrast to frame 820, frame 880 may not cause CKE to be de-asserted, since the force option is not selected. It is noted that a single frame may be associated with each incremental transaction when there are pending transactions in request queue 210 for a given memory rank and when the force option is not selected.

Figure 9:
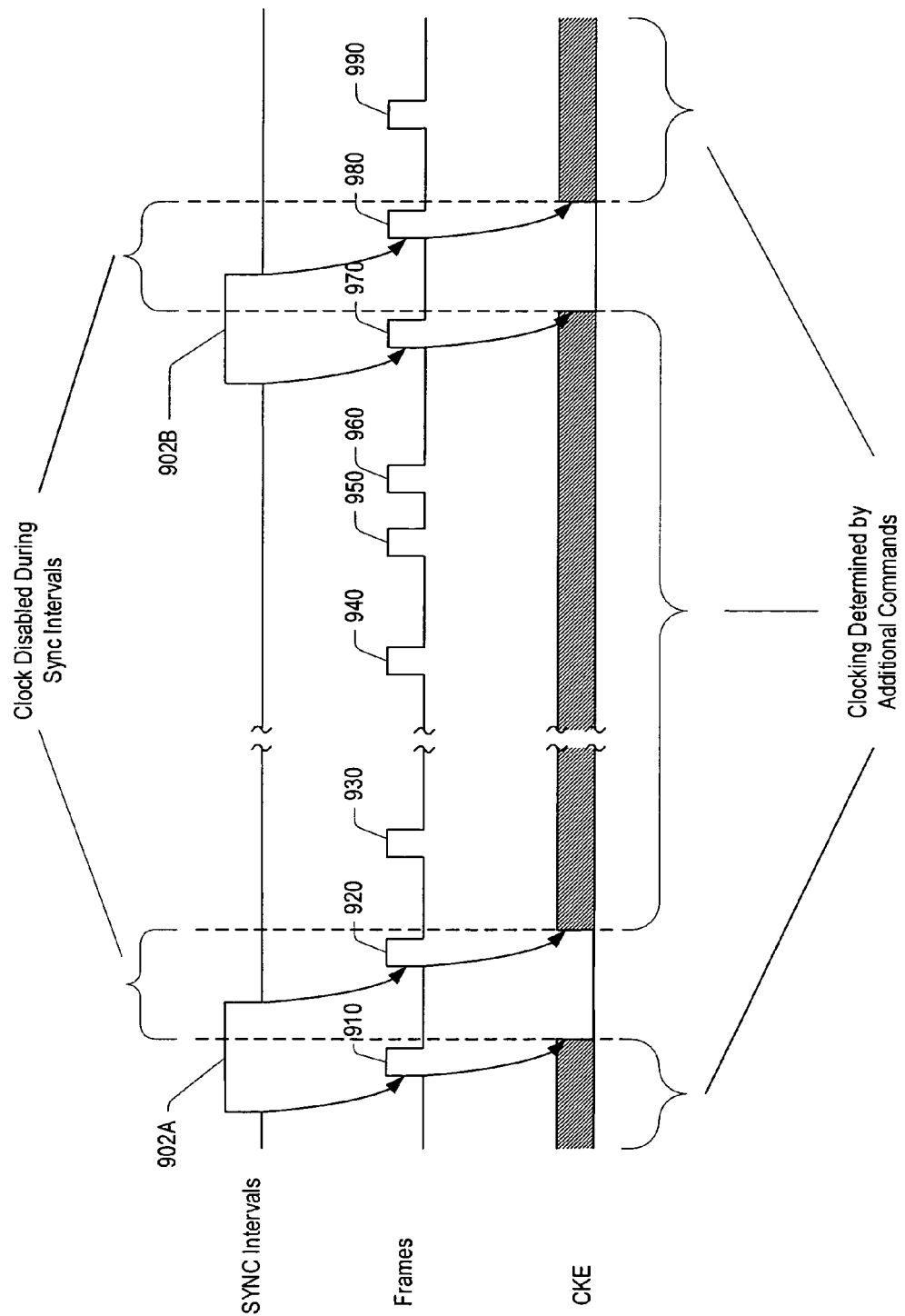
FIG. 9 illustrates one embodiment of the timing of signals that may be used to throttle the clock of a DRAM device during a sync interval.

FIG. 9 illustrates one embodiment of the timing of signals that may be used to throttle the clock of a DRAM device during a sync interval. As shown, a set of sync intervals 902A, 902B, etc. may be associated with a set of command frames 910-990 that may be received by a buffer 130. In addition, the timing of transitions of CKE that enable and disable a clock to one or more DRAM devices is shown.

In one embodiment, sync timer 260 within memory controller 115 may issue a sync pulse 265. A sync pulse 265 may be issued on a periodic basis or at other times and frequencies sufficient to maintain a desired accuracy of clock signals within memory modules 120. For example, in one embodiment, the interval between sync pulses may not be less than the time required for memory controller 115 to issue thirty-two frames or greater than the time required for memory controller 115 to issue forty-two frames. A sync interval 902 may begin at a time when frame generator 250 receives a sync pulse 265. Frame generator 250 may issue a sync frame in response to receiving a sync pulse 265. A sync interval 902 may end at a time when frame generator 250 within memory controller 115 issues the next frame after having issued a sync frame.

As shown, frame 910 may be a sync frame issued in response to the start of sync interval 902A. Frame 920 may be the next frame issued after frame 910. Frames 970 and 980 may have a similar relationship to sync interval 902B. Other frames 930-960 and 990 may be any of a variety of frames such as command frames, read frames, or write frames, etc.

A sync frame, such as frame 910, may not require read or write transactions from memory modules 120. Therefore, from the time at which frame 910 is received until the time at which frame 920 is received, the clock signal provided to DRAM devices may be disabled. Accordingly, in one embodiment, receipt of a sync frame such as frame 910 may cause CKE to be de-asserted as shown in FIG. 9. As is further shown, upon receipt of the next frame, such as from 920, CKE may be re-asserted. Similarly, CKE may be de-asserted and re-asserted after receipt of frames 970 and 980 respectively.

Figure 10:
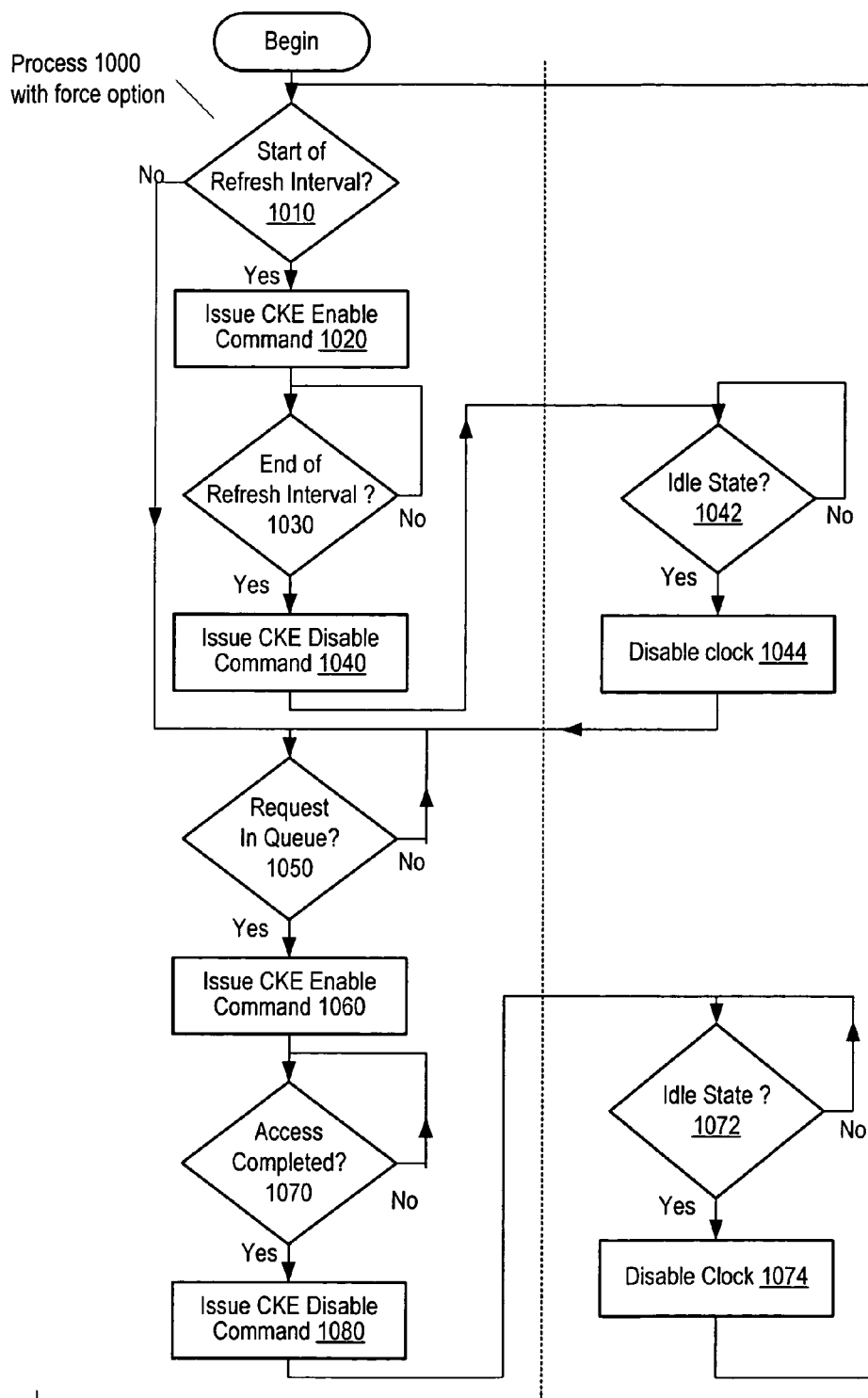
FIG. 10 illustrates one embodiment of a process that may be used to control CKE throttling of a given memory rank between refresh intervals in which a force option is selected.

FIG. 10 illustrates one embodiment of a process 1000 that may be used to control CKE throttling of a given memory rank between refresh intervals in which a force option is selected. As shown, process 1000 comprises several blocks 1010-1080. Blocks depicted on the left side of FIG. 10 may be executed by memory controller 115. Blocks on the right side of FIG. 10 may generally be executed by a buffer 130. Process 1000 may, in one embodiment, begin with a loop that monitors a refresh interval timer for the start of a refresh interval (decision block 1010). Upon detecting the start of a refresh interval, a CKE enable command may be issued and transmitted to the given memory rank where the clock may be enabled (block 1020). Once the CKE command has been transmitted, a loop may be entered to determine if the refresh interval is ended (decision block 1030). At the end of the refresh interval, a CKE disable command may be issued and transmitted to the given memory rank (block 1040). Upon receipt of the CKE disable command, a loop may be entered to determine if each of the memory devices that comprise the given memory rank are in the idle state (decision block 1042). Once the idle state has been reached, the clock associated with each memory device may be disabled (block 1044).

Once the clock associated with each memory device has been disabled, or if the start of a refresh interval has not been detected in decision block 1010, a loop may be entered to monitor a request queue for the presence of access requests targeted to the given memory rank (decision block 1050). In response to detection of the presence of such an access request in the queue, a CKE enable command may be issued and transmitted to the given memory rank (block 1060). Once the CKE command has been transmitted, a loop may be entered to determine if the access has been completed (decision block 1070). Upon detecting the completion of the access, for example, the return of data from a read transaction or the acknowledgment of a write transaction, a CKE disable command may be issued and transmitted to the given memory rank (block 1080). Upon receipt of the CKE disable command, a loop may be entered to determine if each of the memory devices that comprise the given memory rank are in the idle state (decision block 1072). Once the idle state has been reached, the clock associated with each memory device may be disabled (block 1074). Once the clock has been disabled, control may return to decision block 1010 in which the refresh interval timer may be monitored.

In alternative embodiments, the blocks of process 1000 may be executed in a different sequence. For example, decision blocks 1010 and 1050 may execute concurrently. Also, blocks executed by buffer 130 may be executed concurrently with blocks executed by memory controller 115.

Figure 11:
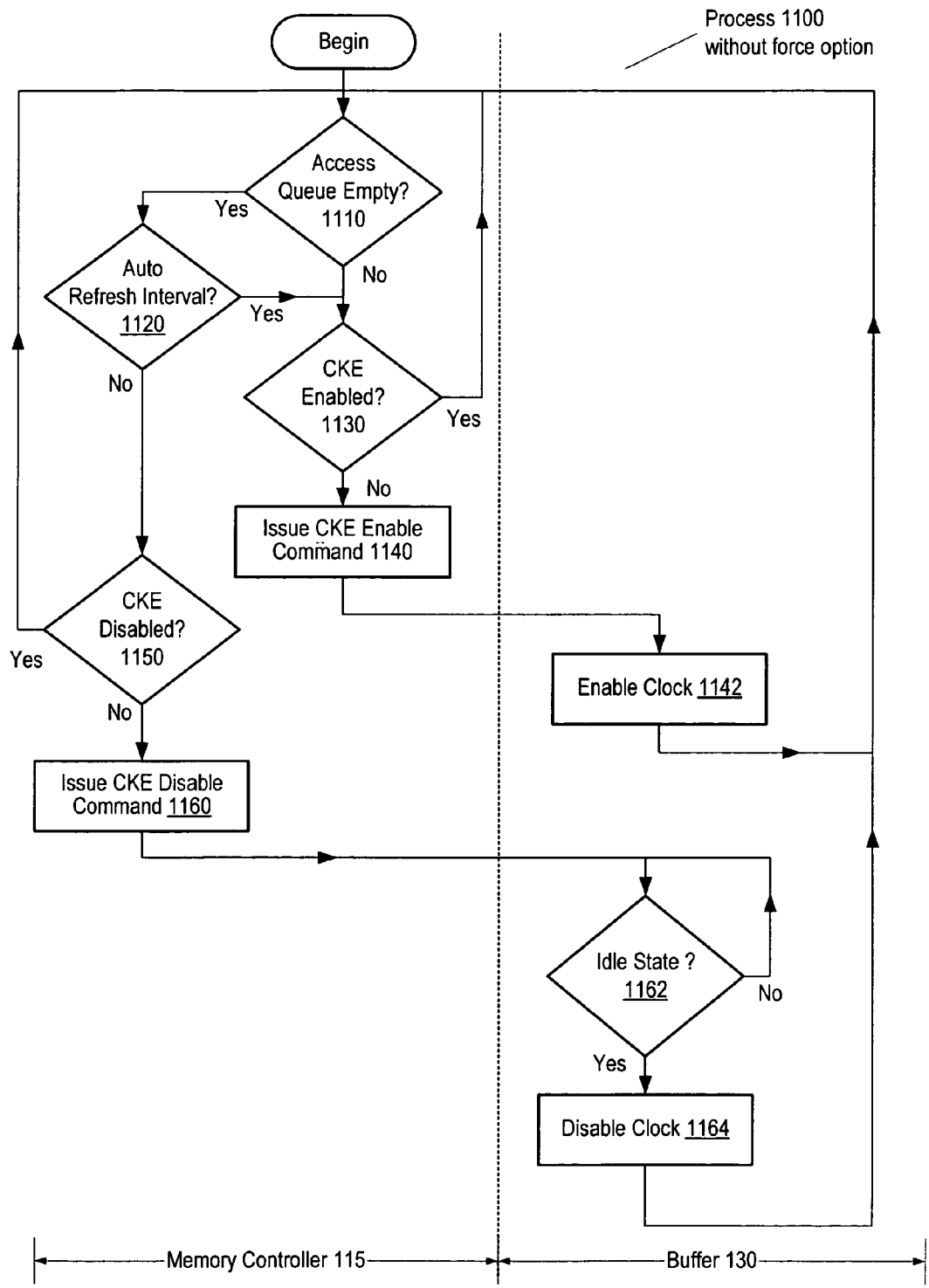
FIG. 11 illustrates an alternative embodiment of a process that may be used to control CKE throttling of a memory rank between refresh intervals in which a force option is not selected.

FIG. 11 illustrates an alternative embodiment of a process 1100 that may be used to control CKE throttling of a memory rank between refresh intervals in which a force option is not selected. As shown, process 1100 comprises several blocks 1110-1164. Blocks depicted on the left side of FIG. 11 may be executed by memory controller 115. Blocks on the right side of FIG. 11 may generally be executed by a buffer 130. Process 1100 may, in one embodiment, begin with a loop that monitors a request queue for the presence of access requests targeted to a given memory rank (decision block 1110). Upon detecting that there are no requests in the queue that are targeted to the given memory rank, a loop may be entered that monitors a refresh interval timer to determine if the given memory rank is in a refresh interval (decision block 1120). Upon detecting that the given memory rank is in a refresh interval or upon detecting the presence of one or more access requests in the request queue targeted to the given memory rank, the status of CKE for the given memory rank may be checked (decision block 1130). If CKE is enabled, then control may return to decision block 1110. If CKE is disabled, a CKE enable command may be issued and transmitted to the given memory rank (block 1140) where the clock may be enabled (block 1142). Once the clock has been enabled, control may return to decision block 1110.

If, in decision block 1120, it is determined that the given memory rank is not in the refresh interval, the status of CKE for the given memory rank may be checked (decision block 1150). If CKE is disabled, then control may return to decision block 1110 in which the request queue is monitored for the presence of access requests targeted for the given memory rank. If CKE is enabled, a CKE disable command may be issued and transmitted to the given memory rank (block 1160). Upon receipt of the CKE disable command, a loop may be entered to determine if each of the memory devices that comprise the given memory rank are in the idle state (decision block 1162). Once the idle state has been reached, the clock associated with each memory device may be disabled (block 1164). Once the clock has been disabled, control may return to decision block 1110 in which the access queue may be monitored.

In alternative embodiments, the blocks of process 1100 may be executed in a different sequence. For example, decision blocks 1110 and 1120 may execute concurrently. Also, blocks executed by buffer 130 may be executed concurrently with blocks executed by memory controller 115.

Figure 12:
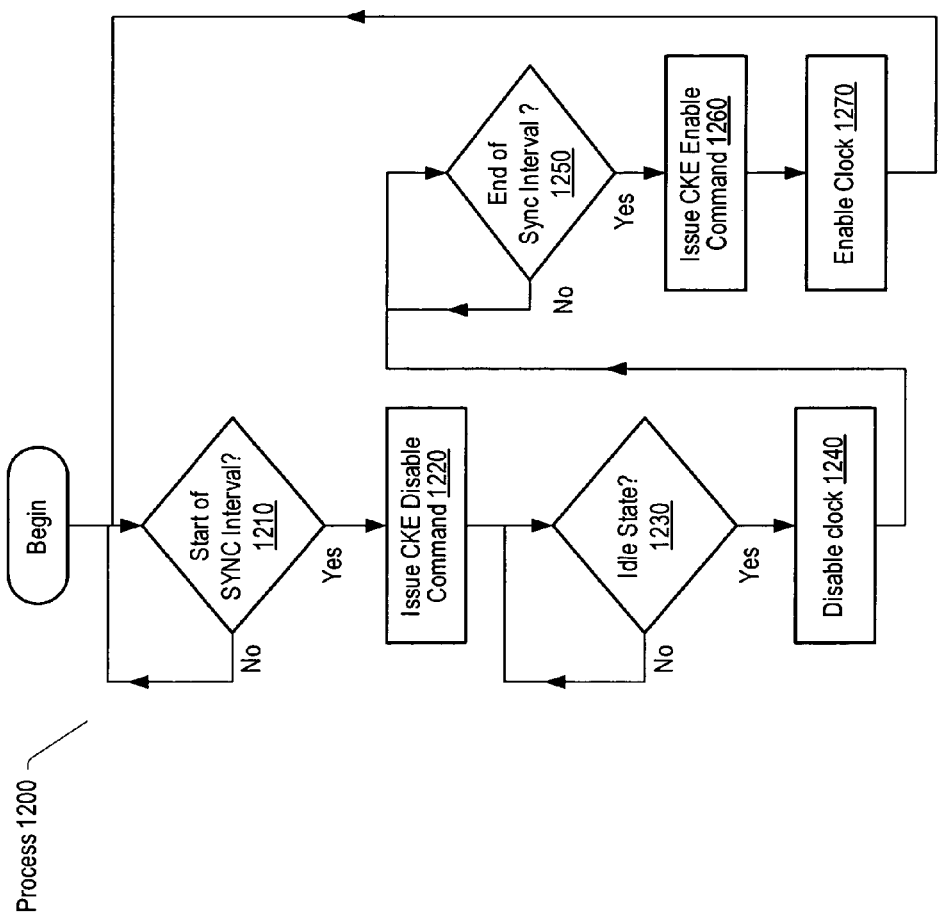
FIG. 12 illustrates one embodiment of a process that may be used to control CKE throttling of a memory rank during a sync interval.

FIG. 12 illustrates one embodiment of a process 1200 that may be used to control CKE throttling of a memory rank during a sync interval. Process 1200 begins with a loop that monitors a sync interval timer for the start of a sync interval (decision block 1210). In response to detecting the start of a sync interval, a CKE disable command may be issued and conveyed to a memory rank (block 1220). Upon receipt of the CKE disable command, a loop may be entered to determine if the memory devices that comprise the memory rank are in the idle state (decision block 1230). Once the idle state has been reached, the clock associated with the memory device may be disabled (block 1240). Once the clock is disabled, a loop may be entered to determine if the sync interval has been completed (decision block 1250). In response to detecting the end of a sync interval, a CKE enable command may be issued and conveyed to a memory rank (block 1260). Upon receipt of the CKE enable command, the clock associated with the memory device may be enabled (block 1270).

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory subsystem comprising:
a memory controller coupled to one or more memory modules, each memory module comprising a buffer coupled to a plurality of memory ranks; and
a clock source coupled to provide a clock signal to each of the memory modules;
wherein the memory controller is configured to convey a clock enable (CKE) command to at least one of the memory modules, the CKE command including a plurality of CKE signals, each corresponding to a respective one of the plurality of memory ranks of the at least one of the memory modules;
wherein in response to the CKE command:
a memory module buffer is configured to convey a CKE disable signal to each memory rank for which the corresponding one of the plurality of CKE signals has a first value; and each memory rank is configured to disable operation of the clock signal within at least a portion of the memory rank, responsive to the CKE disable signal.

2. The system of claim 1, wherein the memory module buffer is configured to convey a CKE enable signal to each memory rank for which the corresponding one of the plurality of CKE signals has a second value; and the given memory rank is configured to enable operation of the clock signal within the at least a portion of the memory rank, responsive to the CKE enable signal.

3. The system of claim 1, wherein the memory controller is configured to convey the CKE command including a CKE signal having a first value and corresponding to a given memory rank responsive to an indication that a memory access transaction between the given memory rank and the memory controller has been completed.

4. The system of claim 3, wherein the memory controller is configured to:
monitor a status of a memory request queue; and
convey the CKE command including a CKE signal having a first value and corresponding to a given memory rank in further response to detecting that the memory request queue does not contain a request addressed to the given memory rank.

5. The system of claim 4, wherein the memory controller is configured to convey the CKE command including a CKE signal corresponding to a given memory rank and having a second value in response to detecting that the memory request queue contains a request addressed to the given memory rank.

6. The system of claim 2, wherein the memory controller is configured to:
convey the CKE command including a CKE signal corresponding to a given memory rank and having a second value in response to detecting a start of a refresh interval; and
convey the CKE command including a CKE signal corresponding to a given memory rank and having a first value in response to detecting an end of the refresh interval.

7. The system of claim 2, wherein the memory controller is configured to:
convey the CKE command including a CKE signal corresponding to a given memory rank and having a first value in response to a start of a sync interval; and
convey the CKE command including a CKE signal corresponding to a given memory rank and having a second value in response to an end of the sync interval.

8. A method in a memory subsystem, the method comprising:
providing a clock signal to one or more memory modules, each memory module comprising a buffer coupled to a plurality of memory ranks;
receiving in a first memory module of the memory modules a clock enable (CKE) command, the CKE command including a plurality of CKE signals, each corresponding to a respective one of the plurality of memory ranks of the at least one of the memory modules;
conveying from a buffer in the first memory module a CKE disable signal to each memory rank for which the corresponding one of the plurality of CKE signals has a first value, responsive to the CKE command; and
disabling operation of the clock signal within at least a portion of each memory rank that receives a CKE disable signal.

9. The method of claim 8, further comprising:
conveying a CKE enable signal to each memory rank for which the corresponding one of the plurality of CKE signals has a second value; and
enabling operation of the clock signal within the at least a portion of each memory rank that receives a CKE enable signal.

10. The method of claim 8, wherein a memory controller is configured to convey the CKE command including a CKE signal having a first value and corresponding to a given memory rank responsive to an indication that a memory access transaction between the memory rank and the memory controller has been completed.

11. The method of claim 10, further comprising:
monitoring a status of a memory request queue; and
the memory controller conveying the CKE command including a CKE signal having a first value and corresponding to a given memory rank in further response to detecting that the memory request queue does not contain a request addressed to the given memory rank.

12. The method of claim 11, further comprising the memory controller conveying the CKE command including a CKE signal corresponding to a given memory rank and having a second value to the memory rank in response to detecting that the memory request queue contains a request addressed to the given memory rank.

13. The method of claim 9, further comprising a memory controller:
conveying the CKE command including a CKE signal corresponding to a given memory rank and having a second value in response to detecting a start of a refresh interval; and
conveying the CKE command including a CKE signal corresponding to a given memory rank and having a first value in response to detecting an end of the refresh interval.

14. The method of claim 9, further comprising a memory controller:
conveying the CKE command including a CKE signal corresponding to a given memory rank and having a first value in response to a start of a sync interval; and
conveying the CKE command including a CKE signal corresponding to a given memory rank and having a second value in response to an end of the sync interval.

15. A processor comprising:
a memory controller configured to be coupled to one or more memory modules, each memory module comprising a buffer coupled to a plurality of memory ranks;
wherein the processor is configured to generate and convey memory access requests to the memory controller; and
wherein the memory controller configured to:
convey a clock enable (CKE) command to at least one of the memory modules, the CKE command including a plurality of CKE signals, each corresponding to a respective one of the plurality of memory ranks of the at least one of the memory modules;
wherein in response to the CKE command:
a memory module buffer is configured to convey a CKE disable signal to each memory rank for which the corresponding one of the plurality of CKE signals has a first value; and
each memory rank is configured to disable operation of the clock signal within at least a portion of the memory rank, responsive to the CKE disable signal.

16. The processor of claim 15, wherein the memory module buffer is configured to convey a CKE enable signal to each memory rank for which the corresponding one of the plurality of CKE signals has a second value; and the given memory rank is configured to enable operation of the clock signal within the at least a portion of the memory rank, responsive to the CKE enable signal.

17. The processor of claim 15, wherein the memory controller is configured to convey the CKE command including a CKE signal having a first value and corresponding to a given memory rank responsive to an indication that a memory access transaction between a memory rank associated with the given buffer and the memory controller has been completed.

18. The processor of claim 17, wherein a memory controller is configured to:
monitor the status of a memory request queue; and
convey the CKE command including a CKE signal having a first value and corresponding to a given memory rank in further response to detecting that the memory request queue does not contain a request addressed to the given memory rank.

19. The processor of claim 18, wherein the memory controller is configured to convey the second CKE command in response to detecting that the memory request queue contains a request addressed to the given memory rank.

20. The processor of claim 16, wherein the memory controller is configured to:
convey the CKE command including a CKE signal corresponding to a given memory rank and having a second value in response to detecting a start of a refresh interval; and
convey the CKE command including a CKE signal corresponding to a given memory rank and having a first value in response to detecting an end of the refresh interval.

21. The processor of claim 16, wherein the memory controller is configured to:
convey the CKE command including a CKE signal corresponding to a given memory rank and having a first value in response to a start of a sync interval; and
convey the CKE command including a CKE signal corresponding to a given memory rank and having a second value in response to an end of the sync interval.

22. A memory module comprising:
a plurality of memory ranks; and
a buffer configured to interconnect a memory controller and the a plurality of memory ranks;
wherein in response to receiving a CKE command from the memory controller including a plurality of CKE signals, each corresponding to a respective one of the plurality of memory ranks, the buffer is configured to convey a CKE disable signal to each memory rank for which the corresponding one of the plurality of CKE signals has a first value; and
wherein each memory rank is configured to disable operation of the clock signal within at least a portion of the memory rank, responsive to the CKE disable signal.

23. The memory module of claim 22, wherein the buffer is further configured to convey a CKE enable signal to each memory rank for which the corresponding one of the plurality of CKE signals has a second value, wherein the given memory rank is configured to enable operation of the clock signal within the at least a portion of the memory rank responsive to the CKE enable signal.

* * * * *